United States Patent
Breen et al.

(10) Patent No.: US 8,872,018 B1
(45) Date of Patent: Oct. 28, 2014

(54) ATOMIC OXYGEN AND ELECTROSTATIC-RESISTANT, FLEXIBLE STRUCTURE FOR SPACE APPLICATIONS

(75) Inventors: Marc L. Breen, Long Beach, CA (US); Ray A. Stribling, Redondo Beach, CA (US); Andrew R. Streett, San Clemente, CA (US); Darren S. Cokin, Santa Monica, CA (US)

(73) Assignee: The Boeing Company, Chicago, IL (US)

( * ) Notice: Subject to any disclaimer, the term of this patent is extended or adjusted under 35 U.S.C. 154(b) by 789 days.

(21) Appl. No.: 13/102,912

(22) Filed: May 6, 2011

(51) Int. Cl.
*H02N 6/00* (2006.01)
*H01L 31/042* (2014.01)
*H01L 31/048* (2014.01)
*B64G 1/44* (2006.01)

(52) U.S. Cl.
CPC .............. *H01L 31/0485* (2013.01); *B64G 1/44* (2013.01); *Y10S 136/292* (2013.01)
USPC .......................................... 136/251; 136/292

(58) Field of Classification Search
CPC ... H01L 31/0422; H01L 31/048; H01L 31/18; H01L 31/0482; H01L 31/0525; H01L 31/0484; H01L 31/052; H01L 31/0521; H01L 31/0522; H01L 31/02167; H01L 31/02168; H01L 31/02327; H01L 31/042; H01L 31/0424; H01L 31/0504; H01L 31/0524; H01L 31/058; H01L 31/02008; H01L 31/02013; H01L 31/02021; H01L 31/022425; H01L 31/02325; H01L 31/0236; H01L 31/028; H01L 31/03923; H01L 31/03928; H01L 31/045; H01L 31/0483; H01L 31/0485; H01L 31/05; H01L 31/06; H01L 31/072; H01L 21/00; H01L 21/44; H01L 21/14; H01L 25/045; H01L 27/1423; H01L 31/0725; H01L 31/0747; H01L 31/1804; H01L 31/0168; H01L 31/1896; H01L 35/28; Y02E 10/50; Y02E 10/47; Y02E 10/52; Y02E 10/44; Y02E 10/45; Y02E 10/547; Y02E 10/563; Y02E 10/60; Y02E 10/725; Y02E 60/15; Y02E 60/17; Y02B 10/20; Y10S 136/292
See application file for complete search history.

(56) References Cited

U.S. PATENT DOCUMENTS

| | | | |
|---|---|---|---|
| 6,983,914 B2* | 1/2006 | Stribling et al. | 244/172.8 |
| 2006/0196535 A1* | 9/2006 | Swanson et al. | 136/244 |
| 2008/0099062 A1* | 5/2008 | Armstrong et al. | 136/248 |

* cited by examiner

*Primary Examiner* — Eli Mekhlin
(74) *Attorney, Agent, or Firm* — Fellix L. Fischer

(57) ABSTRACT

A flexible space structure such as a solar array is composed of multiple solar cell modules (SCMs) each supporting an arrangement of solar cells on a frontside layer and incorporating a backside layer with a surface opposite from the frontside layer having a conductive coating. A selected portion of the SCMs have structural ground extension harnesses intermediate the frontside layer and backside layer. Conductive tapes secure vertically adjacent SCMs by attachment to the conductive coating and electrical jumpers interconnect the structural ground extension harnesses across gapped hinge lines of laterally adjacent SCMs.

23 Claims, 7 Drawing Sheets

ATOMIC OXYGEN AND ELECTROSTATIC-RESISTANT, FLEXIBLE STRUCTURE FOR SPACE APPLICATIONS

STATEMENT REGARDING FEDERALLY SPONSORED RESEARCH OR DEVELOPMENT

This invention was made with Government support under contract number FA9453-10C-0206 awarded by the United States Air Force. The government has certain rights in this invention.

REFERENCE TO RELATED APPLICATIONS

This application is copending with application Ser. No. 12/818,255 entitled SOLAR CELL module filed on Jun. 18, 2010 by inventors Andrew R. Streett, Ray A. Stribling and Darren S. Cokin and application Ser. No. 12/907,273 entitled CARBON NANOTUBE COATED STRUCTURE AND ASSOCIATED METHOD OF FABRICATION by inventors Andrew R. Streett filed on Oct. 19, 2010, both of which have a common assignee with the present application and both of which are incorporated herein by reference as though fully set forth.

BACKGROUND INFORMATION

1. Field

Embodiments of the disclosure relate generally to the field of space structures and more particularly to embodiments for a flexible solar array having panel elements interconnected with layered conductive tapes and layered electrical jumpers providing electrostatic current dissipation across the array.

2. Background

Large solar cell arrays are typically provided for generation of electrical power for satellites and other space craft. Heritage, rigid solar array substrates consist of an aluminum honeycomb core covered by composite facesheets. These substrates may be thick, heavy, and not easily scalable. Furthermore, these large rectangular panels are not ideal for packing into the cylindrical shroud of a launch vehicle. Approaches for solar arrays have been proposed for reductions in weight and stowage volume. Bonded photovoltaic solar cells on a flexible substrate incorporated with flexible printed circuitry, provide a reduction of the substrate mass and wiring. Thin solar panels have an extremely efficient volumetric packing factor allowing higher total power generation with respect to an equivalent rigid solar array. This allows mass budget to be transferred to the payload or dramatic cost reductions and/or downsizing to a smaller and cheaper class of launch vehicle can be accomplished.

Heritage rigid solar panels, as well as other large space structures in general, dissipate electrostatic charge through, a grounding path of graphite facesheets, conductive overlays, aluminum core, and copper wire. In contrast, a flexible solar array or other space structure whose substrate would otherwise be fully insulating may be subject to damage from charge build up and electrostatic discharge.

It is therefore desirable to provide an electro-mechanical configuration and fabrication process which does not impede the advantages of the mechanical structure of advanced bonded solar arrays and similar space structures while allowing dissipation of electrostatic charges that build up on the structure due to incident radiation (i.e. charged particle) in the space environment.

SUMMARY

Embodiments described herein provide a solar array composed of multiple solar cell modules (SCMs). Each SCM supports an arrangement of solar cells on a frontside layer and incorporates a backside layer with a surface opposite the frontside layer having a conductive coating. A selected portion of the SCMs have structural ground extension harnesses intermediate the frontside layer and backside layer. Conductive tapes secure vertically adjacent SCMs by attachment to the conductive coating and electrical jumpers interconnect the structural ground extension harnesses across gapped hinge lines of laterally adjacent SCMs.

The elements of the disclosed embodiments provide an electrostatic charge dissipation system for a solar array by using a conductive coating on solar cell modules (SCMs) supporting an array of solar cells on a frontside layer and incorporating a backside layer with a surface opposite from the frontside layer carrying the conductive coating. Structural ground extension harnesses are provided intermediate the frontside layer and backside layer in a selected portion the SCMs. Conductive tapes secure vertically adjacent SCMs by attachment to the conductive coating. Electrical jumpers interconnect the structural ground extension harnesses of laterally adjacent SCMs across gapped hinge lines.

Using the embodiments disclosed for a method of dissipation of electrostatic charge on a solar array, charge from a conductive coating on a plurality of Solar Cell Modules (SCMs) is conducted into an electrical jumper. The charge buildup in the conductive coating layer is routed through conductive adhesive strips of the electrical jumper and through a conductive polyimide layer into a highly conductive layer. Current is dissipated from the conductive layer through joints welded or soldered through windows in isolating layers between the conductive layer and a structural ground harness. Current is then dissipated through the structural ground harness to a spacecraft ground.

In certain embodiments, the SCMs are vertically attached by conductive tapes. Buildup of electrostatic charge due to incident radiation in a space environment is conducted through a conductive carbon nanotube structure of the conductive coating on the SCMs in which the buildup dissipates through the conductive tape into a vertically adjacent SCM.

The features, functions, and advantages that have been discussed can be achieved independently in various embodiments of the present invention or may be combined in yet other embodiments further details of which can be seen with reference to the following description and drawings.

DETAILED DESCRIPTION

The embodiments described herein provide a flexible solar array with connection elements that utilize layered and segregated conductive and non-conductive tapes and adhesives as well as conducting substrates to provide an enhanced mechanical structure while allowing dissipation of electrostatic charges that build up on the structure due to incident radiation in the space environment. In addition, a carbon nanotube coating provides both protection from atomic oxygen and, as incorporated in the overall enhanced electromechanical structure, a continuous electrostatic dissipative path to spacecraft ground, between areas not covered by the conductive tape or adhesive. The coating is also highly emissive, thereby improving thermal management and efficient operation of the solar array.

Figure 1:
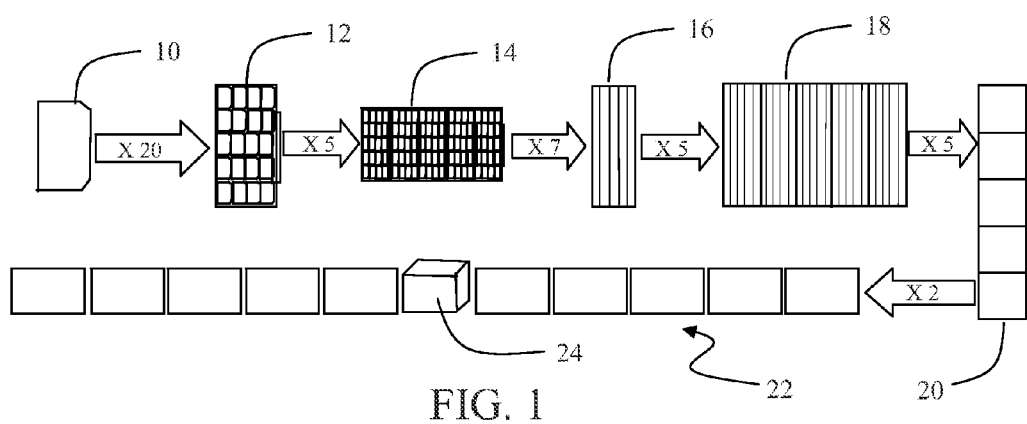
FIG. 1 is a schematic flow diagram of system elements and assembly for an example solar array in which embodiments disclosed may be employed.

As shown in FIG. 1, a solar array employing the embodiments described in detail herein typically incorporates solar cells 10 which are electrically connected in series (approximately 20 solar cells in an exemplary embodiment) defined as a solar cell module (SCM) 12. SCMs are then combined in circuit panels 14, which for the embodiment shown contain five SCMs connected laterally. Circuit panels are then combined into subgroups 16; vertical combinations of seven circuit panels for the embodiment shown and subgroups are then again laterally combined in groups 18 with five subgroups. Groups are then combined in a blanket 20 with two blankets forming a solar array 22 for a spacecraft 24.

Figure 2:
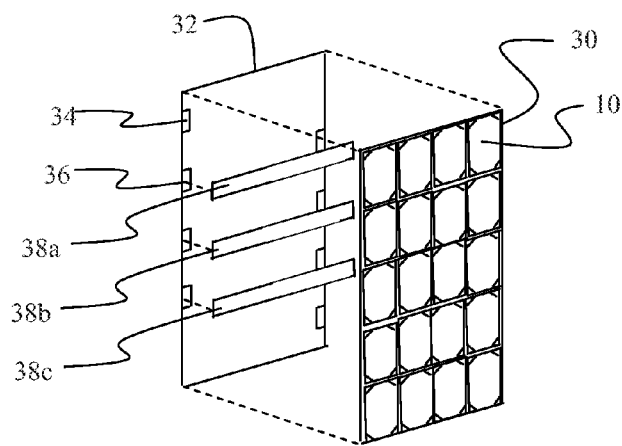
FIG. 2 is an exploded view of a Solar Cell Module (SCM)
Figure 3:
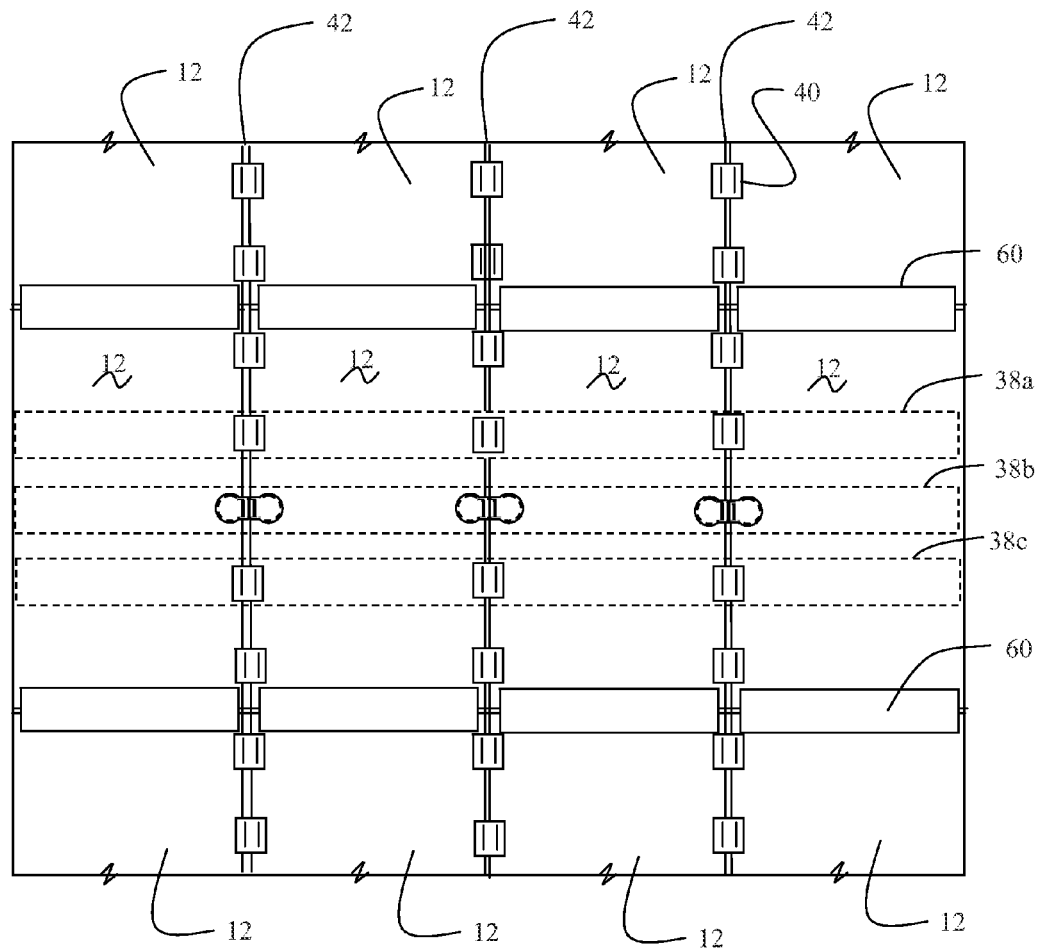
FIG. 3 is a detailed view of a partial detail view of a subgroup of interconnected SCMs.
Figure 4:
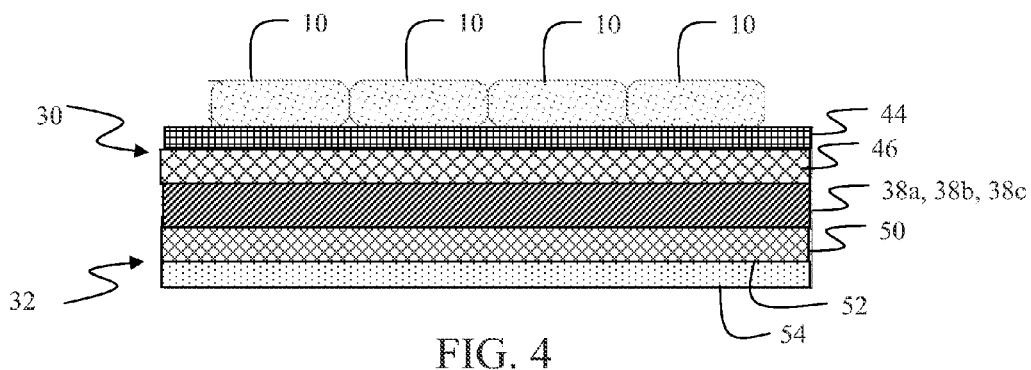
FIG. 4 is a section view of an SCM.

FIG. 2 shows an exploded view of an SCM 12 which includes a frontside layer 30 carrying the individual solar cells 10 and a backside layer 32. Backside layer 32 includes connection windows 34 for end of circuit requirements and extension harness connector windows 36 which provide for interconnection of extension harnesses 38a, 38b and 38c between SCMs in a circuit. As shown in FIG. 3, flexible jumpers 40, special versions of which to be described in greater detail subsequently, are employed to splice together the extension harnesses. The arrangement of SCMs and flexible jumpers allows the solar cell panel formed by circuits 14 to fold along gapped hinge lines 42 between laterally connected SCMs 12 shown in FIG. 3. The general configuration and arrangement of the SCMs may be as disclosed in co-pending application Ser. No. 12/818,255 entitled SOLAR CELL module. FIG. 4 shows an exemplary cross sectional arrangement of the frontside and backside layers. Frontside layer 30 includes the solar cells 10 with an adhesive layer 44 securing the cells to a top polyimide insulating layer 46 such as 1, 2, 4 or 5 mil thickness yellow KAPTON®, a polyimide film, provided by DuPont Chemical Co. The backside layer 32 includes a bottom polyimide insulating layer 50 which is coated on a surface 52 opposite from the frontside layer with a carbon nanotube polymer conductive coating 54 providing high thermal emissivity, protection from atomic oxygen degradation and Electrostatic Discharge (ESD) conductivity as will be described in greater detail subsequently. The conductive coating for an example embodiment may be as disclosed in co-pending application Ser. No. 12/907,273 entitled CARBON NANOTUBE COATED STRUCTURE AND ASSOCIATED METHOD OF FABRICATION. The extension harnesses 38a, 38b and 38c are contained between the top and bottom polyimide insulating layers 46, 50 on the frontside layer 30 and backside layer 32 respectively.

Figure 5:
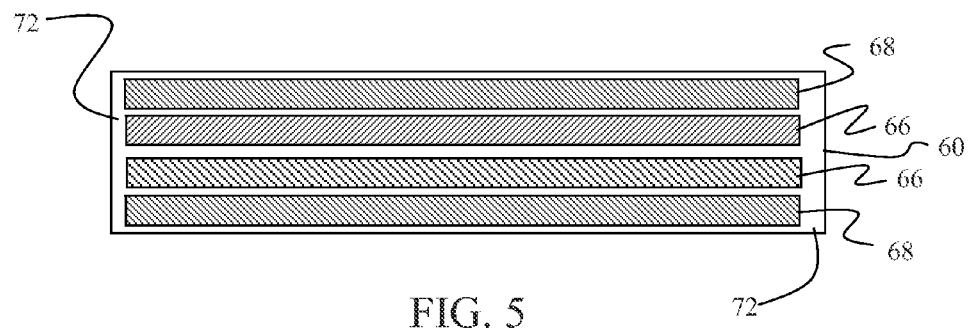
FIG. 5 is a front view of a layered conductive tape for vertical connection of SCMs.
Figure 6:
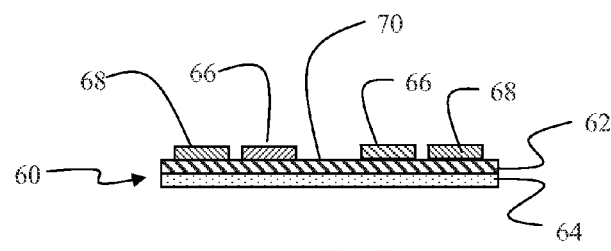
FIG. 6 is a side section view of the layered conductive tape of FIG. 5.

Returning to FIG. 3, vertical interconnection of SCMs 12 in circuit panels 16 is accomplished using layered conductive tapes 60. As shown in detail in FIGS. 5 and 6, the layered conductive tapes 60 incorporate a carbon loaded polyimide layer 62 such as Black Kapton®, a black polyimide film coated with a silicone adhesive, manufactured by DuPont, of approximately 0.002" thickness in an example embodiment, backed by an atomic oxygen (AO) protection barrier 64 as disclosed in application Ser. No. 12/907,273. Electrically conductive adhesive strips 66 are attached on a side of the polyimide layer 62 opposite the AO protection barrier to secure the layered conductive tapes to the backside layers 32 of vertically adjacent SCMs 12 (as seen in FIG. 3). For an exemplary embodiment, a 9713 PSA adhesive is employed manufactured by Minnesota Mining and Manufacturing Co. Additional fastening capability for the layered conductive tapes is provided by structural adhesive strips 68 outboard of the conductive adhesive stripes 66. For an exemplary embodiment, a 3M 100 series adhesive from Minnesota Mining and Manufacturing is used. A gap 70 separates the conductive adhesive strips and similarly, the adhesive strips terminate at the lateral edges of the layered conductive tapes to provide end gaps 72 so that no adhesive is exposed between the edges of SCMs 12 as arranged in the circuit panels 16 where it might result in SCMs 12 or circuit panels 16 sticking together when stowed (folded adjacent one another). In an exemplary embodiment the SCMs are approximately 7" in width and 14" in length. The layered conductive tapes are approximately 1.5" in width and 7" in length. Conductive adhesive stripes are approximately 0.25" wide and structural adhesive stripes are approximately 0.25" wide with gaps 70 and 72 approximately 0.25" in width.

Figure 7:
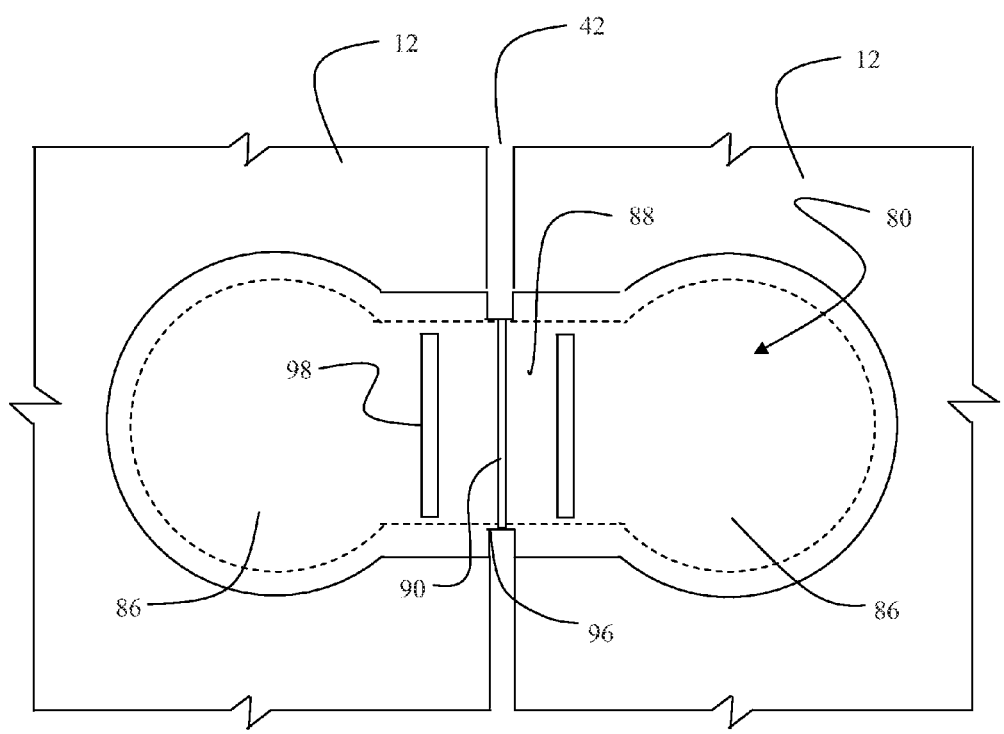
FIG. 7 is a front view of an electrical jumper for interconnection of structural ground extension harnesses between SCMs.

As previously described, interconnection of extension harnesses across adjacent SCMs is accomplished using flexible jumpers 40. Interconnection of at least one of the extension harnesses provides a structural ground for the SCMs in a panel 20. Shown in FIGS. 7 and 8 (thicknesses exaggerated for clarity), an electrical jumper 80 is employed for interconnection of the structural ground extension harnesses 38b in adjacent SCMs 12. Electrical jumper 80 incorporates copper or other conductive layer 82 which is encased in a carbon loaded polyimide layer 84. For the embodiment shown, the conductive layer 82 has conduction diffusion pads 86 and a conductive neck 88 extending across the gap of the hinge line 42 (best seen in FIG. 7). The conductive neck is sufficiently flexible to allow folding of the SCMs 12 along hinge line 42 as previously described. A service loop 90 in the conductive neck may be employed to allow for manufacturing tolerances and thermal contraction/expansion in the SCMs 12. A "valley" fold configuration and "mountain" configuration for inward or outward folding of the SCMs may be employed in certain embodiments. The carbon loaded polyimide layer 84 of the electrical jumper 80 is attached to the conductive coating 54 on the individual SCMs 12 using conductive adhesive strips 90 which may be curved around the periphery of the jumper. An outer conductive coating layer 92 is provided on the outer surface of the electrical jumper 80 for emissive and conductive continuity (the outer conductive coating is not shown in FIG. 7 to reduce the number of hidden layers). An insulating polyimide strip 94 is affixed to the carbon loaded polyimide layer 84 between the conductive adhesive strips 90 for isolation of the conductive elements of the electrical jumper over the gapped hinge line 42. Additionally, the carbon loaded polyimide layer 84 may include notches 96 consistent with the gap at the hingeline 42 (best seen in FIG. 7) allowing greater flexibility in the electrical juniper at the neck 88 of the conductive metal 80.

Electrical interconnection of the structural ground extension harnesses 38b in the opposing SCMs 12 is accomplished in the electrical jumper 80 by providing windows 98 extending through the conductive coating layer 92 and carbon loaded polyimide layer 84 on the outboard side of the highly conductive layer 82 and extending through the insulating polyimide strip 94 and outer insulating polyimide layer 50 of the SCMs 12 to expose copper on the structural ground extension harnesses to allow for welding (or soldering) as represented by arrows 99. Alternative joining techniques to achieve a conductive path may be used such as electric current and pressure to form a silver-to-silver thermal compression bond similar to that employed in interconnects for solar cells or ultrasonic bonding.

Figure 8:
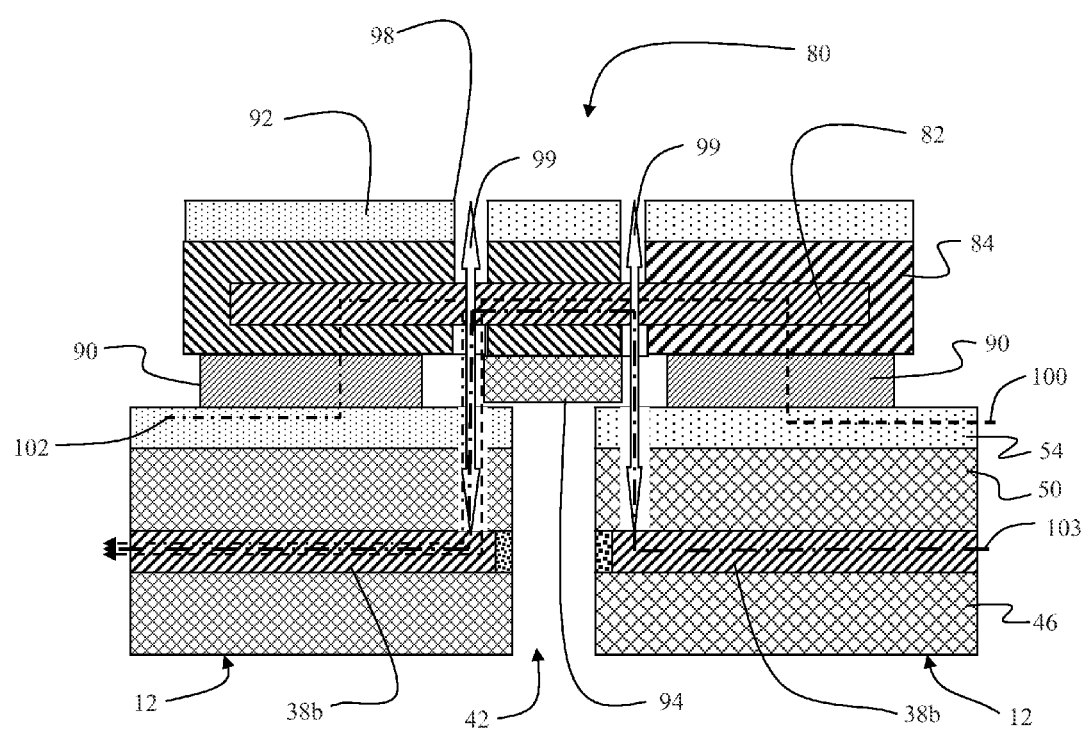
FIG. 8 is a side section view of the electrical jumper of FIG. 7.

The layered elements of the electrical jumper 80 allow current dissipation of electrostatic build up in the SCMs by providing multiple current flow paths. As shown in FIG. 8, charge buildup in the conductive coating 54 on the SCMs is routed as shown by arrows 100 and 102 through the conductive adhesive strips 90 of the electrical jumper 80 and through the conductive polyimide layer 84 into the highly conductive layer 82. From the highly conductive layer 82 the current may be dissipated as shown by the continuation of arrows 100 and 102 from the highly conductive layer 82 through the welded or soldered joints and windows 98 to the structural ground harness and to the spacecraft ground. Current flow from an upstream structural ground harnesses 38b in the SCMs also flows through the electrical jumper as shown by arrow 103 routed from the upstream structural ground harness through the upstream welded or soldered joint, through the highly conductive layer 82 in the electrical jumper, back through the downstream welded or soldered joint to the downstream structural ground harness.

Figure 9:
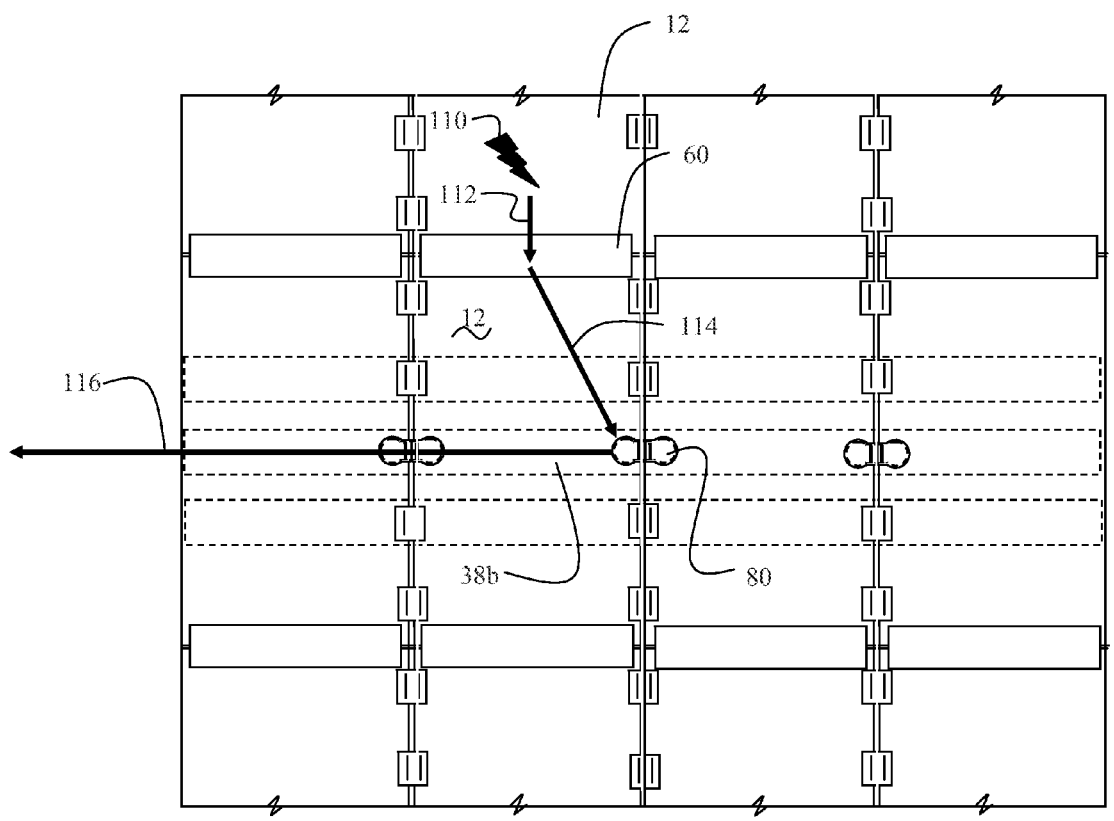
FIG. 9 is a schematic representation of electrostatic charge dissipation by an example embodiment.

As shown in FIG. 9, the layered conductive tapes 60 interconnecting the SCMs vertically provide conductive paths for electrostatic charge dissipation. Buildup of electrostatic charge due to incident radiation in a space environment, represented as a localized charge 110, is conducted, as represented by arrow 112, through the conductive carbon nanotube structure of the conductive coating 54 of the SCM(s) in which the buildup occurs, through the conductive tape 60 into the vertically adjacent SCM where the charge is conducted, arrow 114, into the electrical jumper 80 for dissipation into the structural ground harness 38b as described previously with respect to FIG. 8 and represented by arrow 116. The embodiment disclosed provides an electrostatic dissipation system for the entire solar array.

Figure 10:
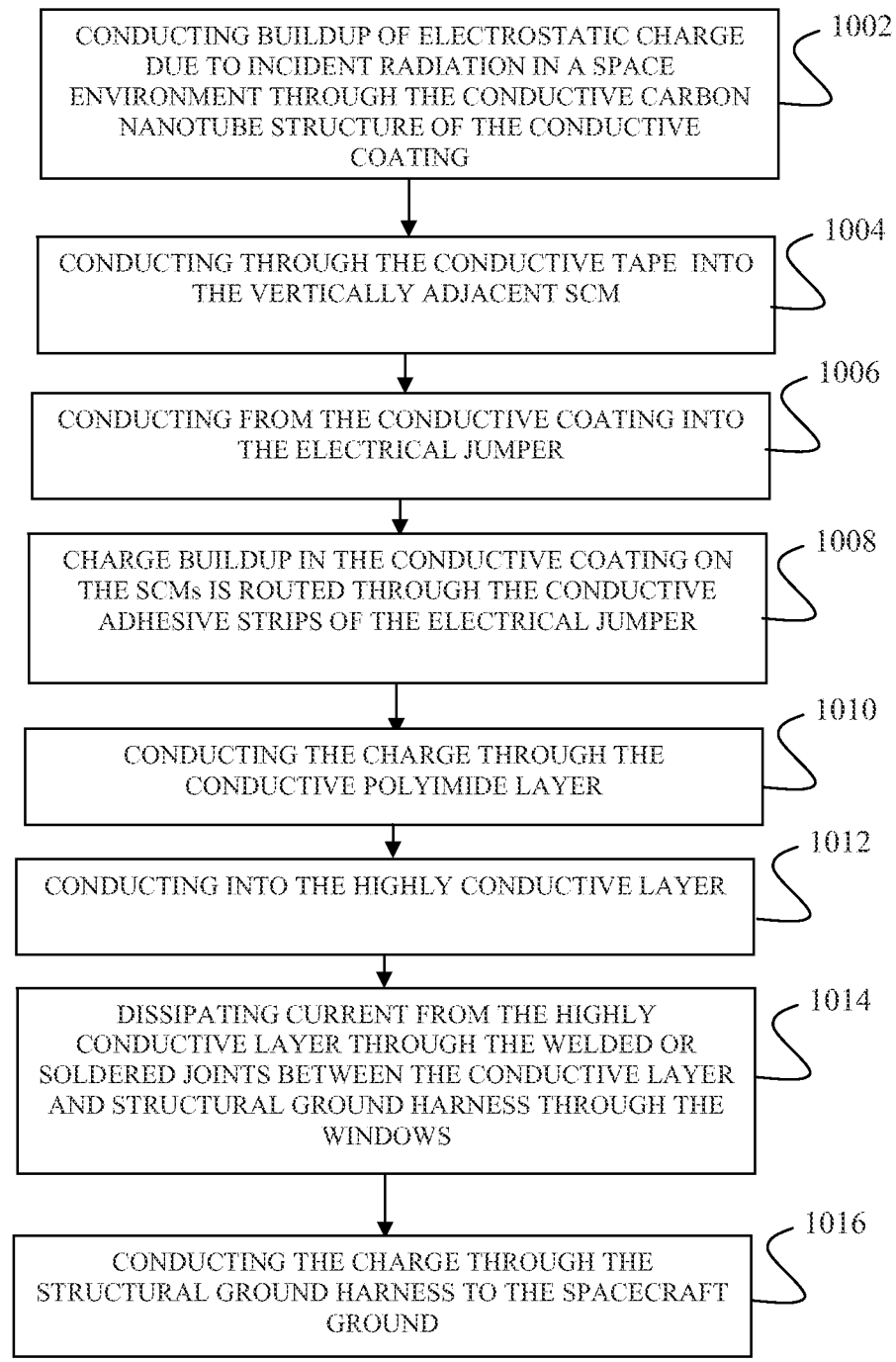
FIG. 10 is a flow chart of electrostatic dissipation as accomplished by the embodiments disclosed.

The embodiments disclosed provide dissipation of electrostatic charge as shown in FIG. 10 by conducting buildup of electrostatic charge due to incident radiation in a space environment through the conductive carbon nanotube structure of the conductive coating 54 of the SCM(s) in which the buildup occurs, step 1002, through the conductive tape 60 into the vertically adjacent SCM, step 1004. The charge is conducted from the conductive coating into the electrical jumper 80, step 1006, for dissipation into the structural ground harness 38b as described previously with respect to FIG. 8. Charge buildup in the conductive coating 54 on the SCMs is routed through the conductive adhesive strips 90 of the electrical jumper 80, step 1008, and through the conductive polyimide layer 84, step 1010 into the highly conductive layer 82, step 1012. From the highly conductive layer 82 the current may be dissipated as shown by the continuation of arrows 100 and 102 from the highly conductive layer 82 through the welded or soldered joints between the highly conductive layer and structural ground harness 38b through the windows 98, step 1014 and through the structural ground harness 38b to the spacecraft ground, step 1016.

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A solar array comprising:
    a plurality of solar cell modules (SCMs) each supporting an arrangement of solar cells on a frontside layer and incorporating a backside layer with a surface opposite from the frontside layer having a conductive coating, a selected portion of said plurality of SCMs having a structural ground extension harness intermediate the frontside layer and backside layer;
    conductive tapes securing vertically adjacent SCMs by attachment to the conductive coating; and
    electrical jumpers interconnecting of the structural ground extension harnesses of laterally adjacent SCMs in the selected portion of SCMs across gapped hinge lines.

2. The solar array as defined in claim 1 wherein the frontside layer comprises a top insulating layer and an adhesive layer securing the solar cell array to the top insulating layer.

3. The solar array as defined in claim 2 wherein the backside layer comprises a bottom insulating layer on which the conductive coating is adhered.

4. The solar array as defined in claim 3 wherein the top and bottom insulating layers are polyimide.

5. The solar array as defined in claim 1 in which the conductive tapes comprise:
    a carbon loaded polyimide layer backed by an atomic oxygen (AO) protection barrier;
    conductive adhesive strips attached to the polyimide layer opposite the AO protection barrier, said strips positioned with a gap aligned with the gapped hinge line;
    and
    structural adhesive strips attached to the polyimide layer opposite the AO protection barrier outboard from the conductive adhesive strips.

6. The solar array as defined in claim 5 wherein the conductive adhesive strips and structural adhesive strips terminate to provide a gap at lateral edges of the carbon loaded polyimide layer.

7. The solar array as defined in claim 1 wherein the electrical jumper comprises:
    a conductive layer encased in a carbon loaded polyimide layer said conductive layer having conduction diffusion pads and a conductive neck extending across the gap of the hinge line, said conductive neck sufficiently flexible to allow folding of the SCMs along the hinge line;
    conductive adhesive strips attaching the carbon loaded polyimide layer to the conductive coating on laterally adjacent SCMs; and,
    an outer conductive coating on an outer surface of the electrical jumper for thermal emissivity, atomic oxygen resistance, and conductive continuity , 8. The solar array as defined in claim 7 further comprising an insulating polyimide strip affixed to the carbon loaded polyimide layer between the conductive adhesive strips for isolation of the outer conductive coating and the conductive layer of the electrical jumper over the gapped hinge line.

9. The solar array as defined in claim 7 wherein the carbon loaded polyimide includes notches consistent with the gap at the hingeline.

10. The solar array as defined in claim 7 wherein the conductive neck has a service loop to allow for manufacturing tolerances and thermal contraction/expansion in the SCMs.

11. The solar array as defined in claim 10 wherein the service loop is selected from a valley fold configuration and mountain configuration for inward or outward folding of the SCMs.

12. An electrostatic charge dissipation system comprising:
a conductive coating on each of a plurality of modules, each module having a frontside layer and a backside layer with a surface opposite from the frontside layer carrying the conductive coating, said plurality of modules arranged laterally and vertically adjacent and wherein the modules are solar cell modules;
structural ground extension harnesses intermediate the frontside layer and backside layer in a selected portion of said plurality of modules;
conductive tapes securing vertically adjacent modules by attachment to the conductive coating; and, electrical jumpers interconnecting of the structural ground extension harnesses of laterally adjacent modules in the selected portion of modules across gapped hinge lines.

13. The electrostatic charge dissipation system as defined in claim 12 wherein the frontside layer comprises a top insulating layer and an adhesive layer securing a solar cell array to the top insulating layer.

14. The electrostatic charge dissipation system as defined in claim 13 wherein the backside layer comprises a bottom insulating layer on which the conductive coating is adhered.

15. The electrostatic charge dissipation system as defined in claim 14 wherein the top and bottom insulating layers are polyimide.

16. The electrostatic charge dissipation system as defined in claim 12 in which the conductive tapes comprise:
a carbon loaded polyimide layer backed by an atomic oxygen (AO) protection barrier;
conductive adhesive strips attached to the polyimide layer opposite the AO protection barrier, said strips positioned with a gap aligned with the gapped hinge line; and
structural adhesive strips attached to the polyimide layer opposite the AO protection barrier outboard from the conductive adhesive strips.

17. The electrostatic charge dissipation system as defined in claim 16 wherein the conductive adhesive strips and structural adhesive strips terminate to provide a gap at lateral edges of the carbon loaded polyimide layer.

18. The electrostatic charge dissipation system as defined in claim 12 wherein the electrical jumper comprises:
a conductive layer encased in a carbon loaded polyimide layer said conductive layer having conduction diffusion pads and a conductive neck extending across the gap of the hinge line, said conductive neck sufficiently flexible to allow folding of the modules along the hinge line;
conductive adhesive strips attaching the carbon loaded polyimide layer to the conductive coating on laterally adjacent modules; and
an outer conductive coating on an outer surface of the electrical jumper for emissive and conductive continuity.

19. The electrostatic charge dissipation system as defined in claim 18 further comprising an insulating polyimide strip affixed to the carbon loaded polyimide layer between the conductive adhesive strips for isolation of the conductive elements of the electrical jumper over the gapped hinge line.

20. The electrostatic charge dissipation system as defined in claim 18 wherein the carbon loaded polyimide includes notches consistent with the gap at the hingeline.

21. A method for dissipation of electrostatic charge on a solar array comprising:
conducting charge from a conductive coating on a plurality of Solar Cell Modules (SCMs) into an electrical jumper;
routing charge buildup in the conductive coating layer through conductive adhesive strips of the electrical jumper and through a conductive polyimide layer into a highly conductive layer;
dissipating current from the conductive layer through joints welded or soldered through windows in isolating layers between the conductive layer and a structural ground harness; and
dissipating current through the structural ground harness to a ground.

22. The method of claim 21 wherein the SCMs are vertically attached by conductive tapes and further comprising:
conducting buildup of electrostatic charge due to incident radiation in a space environment through a conductive carbon nanotube structure of the conductive coating of the SCMs in which the buildup occurs; and
conducting the electrostatic charge through the conductive tape into a vertically adjacent SCM.

23. The method of claim 22 wherein the step of conducting the electrostatic charge through the conductive tape comprises:
conducting electrostatic charge from the conductive coating in a first SCM through a first conductive adhesive strip;
conducting the electrostatic charge through a carbon loaded polyimide layer; and,
conducting the electrostatic charge from the carbon loaded polyimide layer through a second conductive adhesive strip to the conductive coating in a second SCM.

* * * * *